US009827578B2

(12) United States Patent
Kudela et al.

(10) Patent No.: US 9,827,578 B2
(45) Date of Patent: Nov. 28, 2017

(54) TIGHTLY FITTED CERAMIC INSULATOR ON LARGE AREA ELECTRODE

(71) Applicant: Applied Materials, Inc., Santa Clara, CA (US)

(72) Inventors: Jozef Kudela, San Jose, CA (US); Jonghoon Baek, San Diego, CA (US); John M. White, Hayward, CA (US); Robin Tiner, Santa Cruz, CA (US); Suhail Anwar, Saratoga, CA (US); Gaku Furuta, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 432 days.

(21) Appl. No.: 14/726,067

(22) Filed: May 29, 2015

(65) Prior Publication Data
US 2015/0273490 A1 Oct. 1, 2015

Related U.S. Application Data

(62) Division of application No. 13/110,184, filed on May 18, 2011, now Pat. No. 9,068,262.
(Continued)

(51) Int. Cl.
*B05B 1/18* (2006.01)
*H01J 37/32* (2006.01)
(Continued)

(52) U.S. Cl.
CPC ........ *B05B 1/185* (2013.01); *C23C 16/45565* (2013.01); *C23C 16/5096* (2013.01);
(Continued)

(58) Field of Classification Search
CPC ................ B05B 1/185; H01J 37/32623; H01J 37/32651; H01J 37/3244; H01J 37/32532;
(Continued)

(56) References Cited

U.S. PATENT DOCUMENTS 5,846,332 A * 12/1998 Zhao ................... C23C 16/4411
                                                              118/500
6,050,216 A    4/2000 Szapucki et al.
(Continued)

FOREIGN PATENT DOCUMENTS

JP    2005256172 A    9/2005
JP    2007123840 A    5/2007

OTHER PUBLICATIONS

International Search Report and Written Opinion of PCT/US2011/036932 dated Jan. 6, 2012.
(Continued)

*Primary Examiner* — Jeffrie R Lund
(74) *Attorney, Agent, or Firm* — Patterson + Sheridan LLP

(57) ABSTRACT

Embodiments of the invention generally include shield frame assembly for use with a showerhead assembly, and a showerhead assembly having a shield frame assembly that includes an insulator that tightly fits around the perimeter of a showerhead in a vacuum processing chamber. In one embodiment, a showerhead assembly includes a gas distribution plate and a multi-piece frame assembly that circumscribes a perimeter edge of the gas distribution plate. The multi-piece frame assembly allows for expansion of the gas distribution plate without creating gaps which may lead to arcing. In other embodiments, the insulator is positioned to be have the electric fields concentrated at the perimeter of the gas distribution plate located therein, thereby reducing arcing potential.

18 Claims, 6 Drawing Sheets

Related U.S. Application Data

(60) Provisional application No. 61/346,907, filed on May 21, 2010.

(51) Int. Cl.
*C23C 16/509* (2006.01)
*C23C 16/455* (2006.01)

(52) U.S. Cl.
CPC .... *H01J 37/3244* (2013.01); *H01J 37/32623* (2013.01); *H01J 37/32651* (2013.01); *C23C 16/509* (2013.01); *H01J 37/32532* (2013.01); *Y10T 137/6851* (2015.04)

(58) Field of Classification Search
CPC .......... C23C 16/5096; C23C 16/45565; C23C 16/509; Y10T 137/6851
See application file for complete search history.

(56) References Cited

U.S. PATENT DOCUMENTS

| | | | |
|---|---|---|---|
| 6,368,450 B2 | 4/2002 | Hayashi | |
| 6,477,980 B1 | 11/2002 | White et al. | |
| 6,772,827 B2 | 8/2004 | Keller et al. | |
| 6,823,589 B2 | 11/2004 | White et al. | |
| 7,017,269 B2 | 3/2006 | White et al. | |
| 7,484,473 B2 | 2/2009 | Keller et al. | |
| 7,722,925 B2 | 5/2010 | White et al. | |
| 7,776,178 B2 | 8/2010 | Keller | |
| 9,068,262 B2 * | 6/2015 | Kudela | C23C 16/45565 |
| 2002/0069968 A1 | 6/2002 | Keller et al. | |
| 2003/0066607 A1 | 4/2003 | White et al. | |
| 2003/0132319 A1 | 7/2003 | Hytros et al. | |
| 2004/0069230 A1 | 4/2004 | Fukuoka et al. | |
| 2004/0084410 A1 * | 5/2004 | Lenz | H01J 37/32009 216/67 |
| 2004/0118345 A1 | 6/2004 | White et al. | |
| 2004/0206305 A1 | 10/2004 | Choi et al. | |
| 2005/0000432 A1 | 1/2005 | Keller et al. | |
| 2005/0133160 A1 | 6/2005 | Kennedy et al. | |
| 2005/0183827 A1 * | 8/2005 | White | C23C 16/45565 156/345.34 |
| 2006/0011137 A1 | 1/2006 | Keller | |
| 2007/0273289 A1 * | 11/2007 | Burtner | H01J 27/146 315/111.91 |
| 2007/0295602 A1 | 12/2007 | Tiller et al. | |
| 2008/0078744 A1 | 4/2008 | Wang et al. | |
| 2008/0099146 A1 | 5/2008 | Keller | |
| 2008/0183827 A1 | 7/2008 | Rege et al. | |
| 2010/0206483 A1 | 8/2010 | Sorensen et al. | |
| 2011/0139372 A1 | 6/2011 | Blonigan et al. | |
| 2011/0284100 A1 | 11/2011 | Kudela et al. | |
| 2013/0084408 A1 | 4/2013 | Nakao et al. | |
| 2013/0101241 A1 | 4/2013 | Hou et al. | |
| 2014/0252134 A1 * | 9/2014 | Chen | C23C 16/45565 239/548 |
| 2015/0235865 A1 * | 8/2015 | Wang | H01L 21/324 438/704 |
| 2015/0273490 A1 * | 10/2015 | Kudela | C23C 16/45565 239/548 |

OTHER PUBLICATIONS

Official Letter dated Jan. 16, 2015 from Japan Patent Office for corresponding Japan Patent Application No. 2013-511318.

* cited by examiner

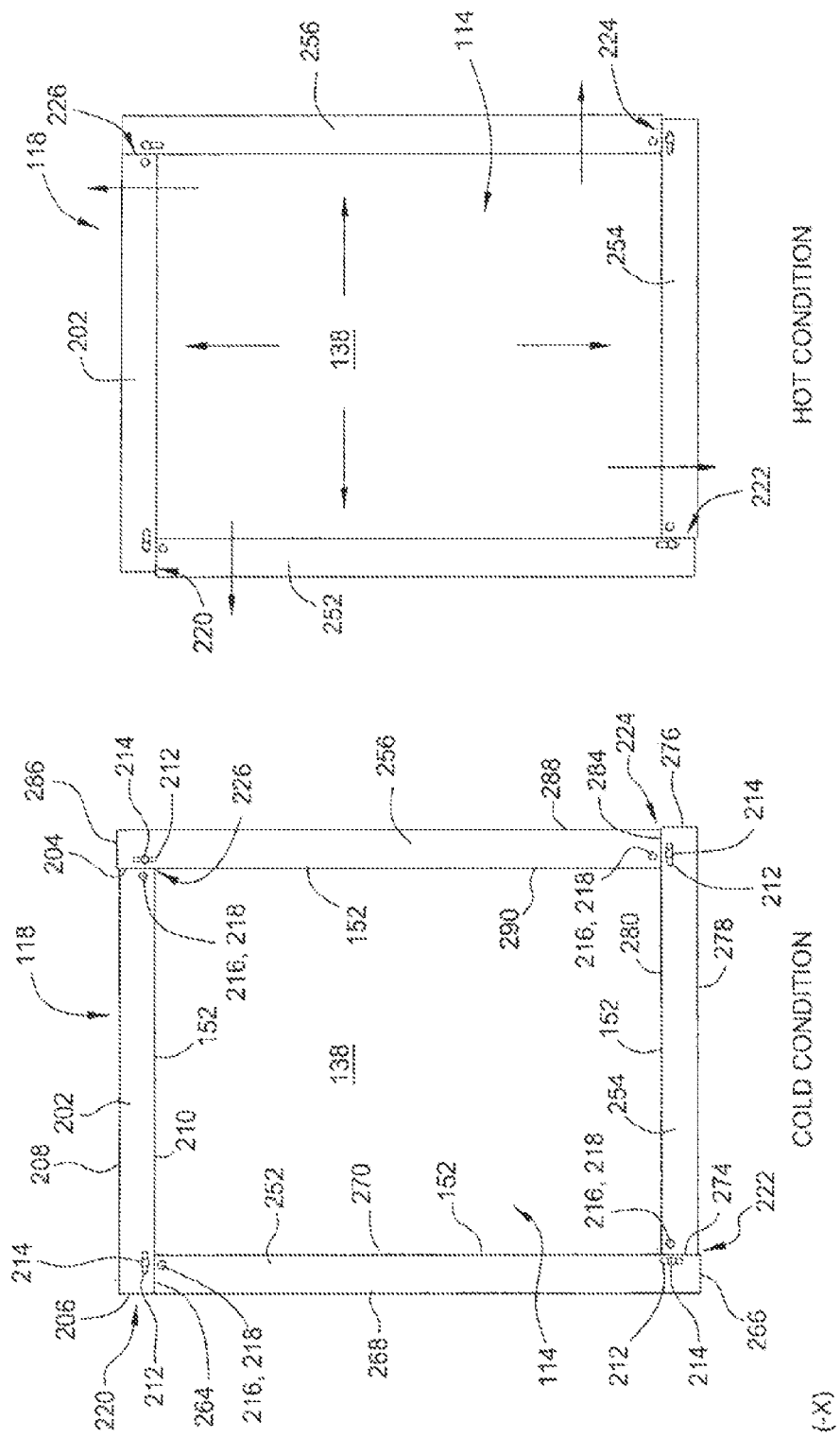

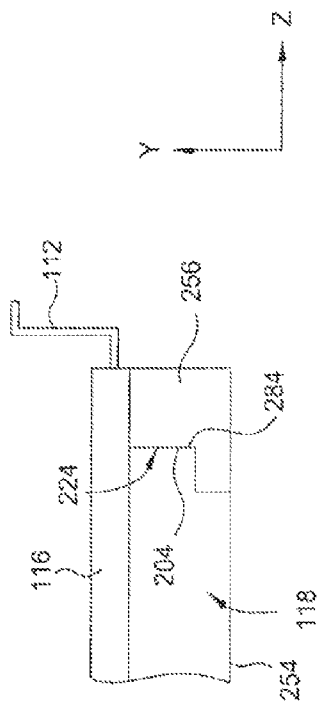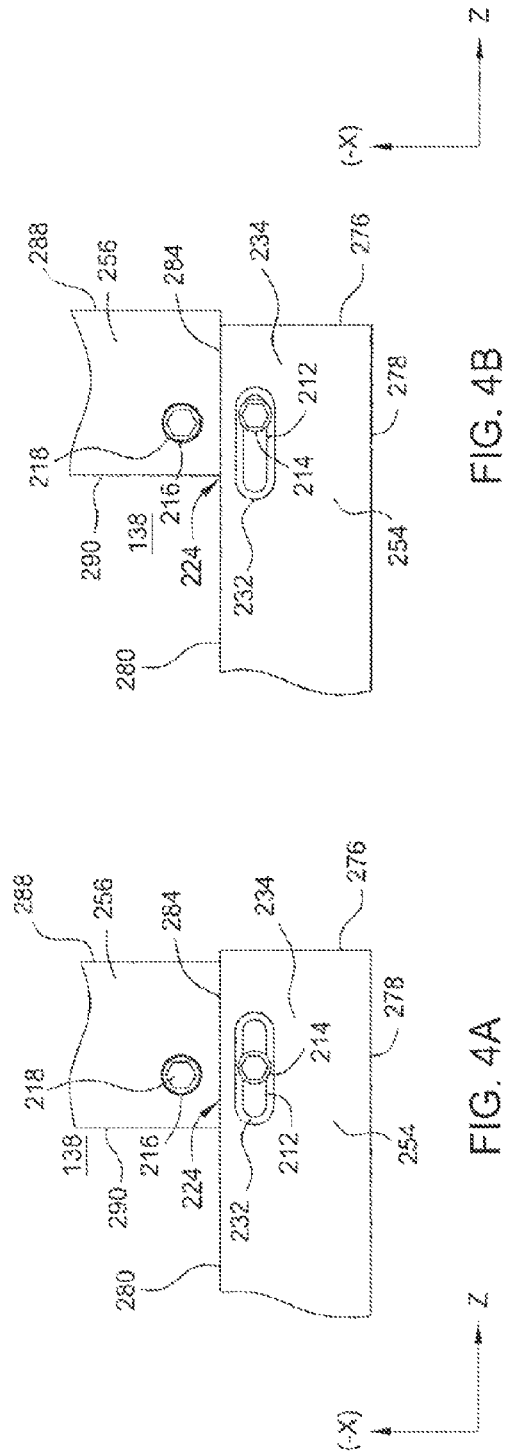

TIGHTLY FITTED CERAMIC INSULATOR ON LARGE AREA ELECTRODE

CROSS-REFERENCE TO RELATED APPLICATION

This application is a divisional of U.S. patent application Ser. No. 13/110,184, filed May 18, 2011 and U.S. Provisional Application Ser. No. 61/346,907, filed May 21, 2010, both of which are incorporated by reference in their entirety.

BACKGROUND OF THE INVENTION

Field of the Invention

The invention generally relates to an electrode, such as a showerhead assembly, having a tightly fitted ceramic insulator.

Description of Related Art

In large area, rectangular PECVD chambers used for processing substrates larger than 1.5 meter square, the tendency to experience arcing around the perimeter of the driven electrode is greater than smaller chambers operating under the same intrinsic processing conditions, such as RF frequency and power density, electrode spacing, pressure and gas chemistry. For chambers having electrodes on the order of two to three meters in two dimensions, arcing may be experienced at such low applied RF power levels that useful films and/or sufficiently useful deposition rates and commercial productivity cannot be achieved.

Thus, there is a need for an improved electrode suitable for use in large area PECVD chambers and the like.

SUMMARY OF THE INVENTION

Embodiments of the invention generally include shield frame assembly for use with a showerhead assembly, and a showerhead assembly having a shield frame assembly that includes an insulator that tightly fits around the perimeter of a showerhead in a vacuum processing chamber. In one embodiment, a multi-piece frame assembly for circumscribing a perimeter edge of the gas distribution plate showerhead assembly is provided. The multi-piece frame assembly includes a first short elongated frame member having a hole in a first end and a slot in a second end, a second short elongated frame member having a hole in a first end and a slot in a second end, a first long elongated frame member having a hole in a first end and a slot in a second end, and a second long elongated frame member having a hole in a first end and a slot in a second end.

In another embodiment of the invention, a showerhead assembly includes a gas distribution plate and a multi-piece frame assembly. The multi-piece frame assembly circumscribes a perimeter edge of the gas distribution plate. The multi-piece frame assembly includes a first frame member and a second frame member. The first frame member has a free end abutting a fixed end of the second frame member.

In another embodiment, the showerhead assembly includes an insulative frame assembly circumscribing a perimeter edge of a gas distribution plate. A conducting element is disposed in the insulative frame assembly and electrically coupled to the gas distribution plate.

The objective of the present invention will no doubt become obvious to those of ordinary skill in the art after reading the following detailed description of the preferred embodiment, which is illustrated in following figures and drawings.

BRIEF DESCRIPTION OF THE APPENDED DRAWINGS

The teachings of the present invention can be readily understood by considering the following detailed description in conjunction with the accompanying drawings, in which:

FIG. 2 is a bottom view of one embodiment of the shield frame assembly mounted to a gas distribution plate assembly:

FIG. 3 depicts a shield frame assembly and gas distribution plate assembly of FIG. 2 in a heated condition;

Figure 6:
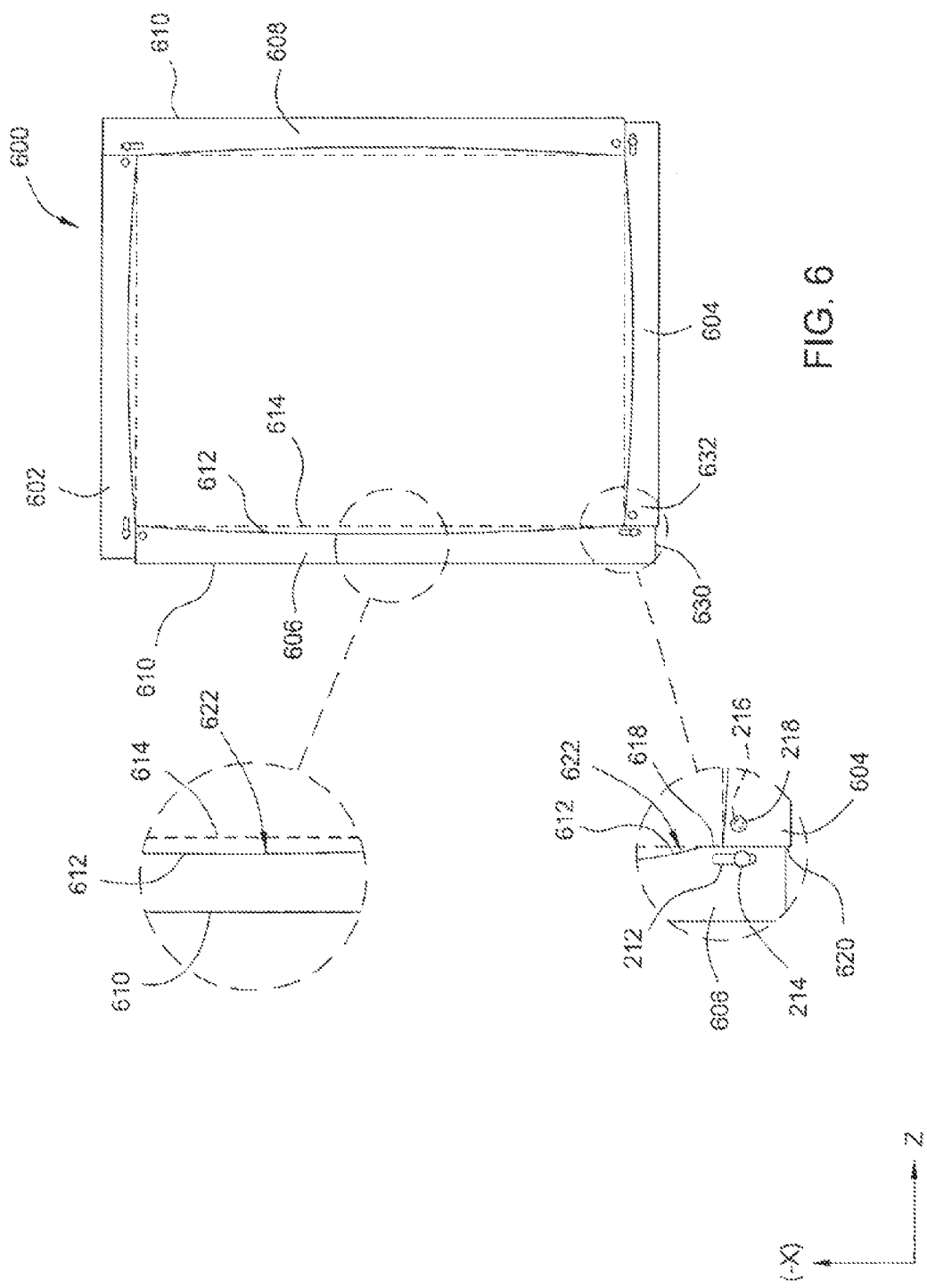

FIGS. 4A-C are side and bottom views of an interface of the shield frame assembly of FIG. 2 in cooled and heated conditions;

FIGS. 5A-F depict exemplary sectional profiles of various embodiments of a shield frame assembly;

FIG. 6 is a plan view of another embodiment of a shield frame assembly.

To facilitate understanding, identical reference numerals have been used, where possible, to designate identical elements that are common to the figures. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention generally include a shield frame assembly that includes a multi-piece insulator that tightly fits around the perimeter of a PECVD showerhead assembly. The multi-piece insulator is configured to maintain a tight fit during thermally-induced expansion and contraction of the showerhead assembly, thereby minimizing arcing potential. Additionally, the multi-piece insulator functions to cover and seal the perimeter of the showerhead to prevent arcing to adjacent chamber components. In one embodiment, the shield frame assembly prevents arcing by physically covering the perimeter of the showerhead assembly with an insulating material. The insulating material may be ceramic or other suitable material. Additionally, in other embodiments, the perimeter of the showerhead assembly and/or multi-piece ceramic insulator includes a radius to reduce electric field concentrations, which additionally reduces the potential of arcing. In other embodiments, a conducting element is present in the shield frame assembly which is electrically connected to or part of the showerhead assembly such that the conducting element operates at essentially the same voltage of the showerhead assembly, thereby reducing the electric field on the exposed perimeter of the showerhead assembly. Although embodiments of the invention are illustratively described with reference to a PECVD showerhead assembly, it is contemplated that the invention may be utilized in other plasma-assisted processes such as CVD, ALD, etching and the like. It is also contemplated that the shield frame assembly may be utilized on other quadrilateral objects having different coefficients of thermal expansion relative to the shield frame assembly.

Figure 1:
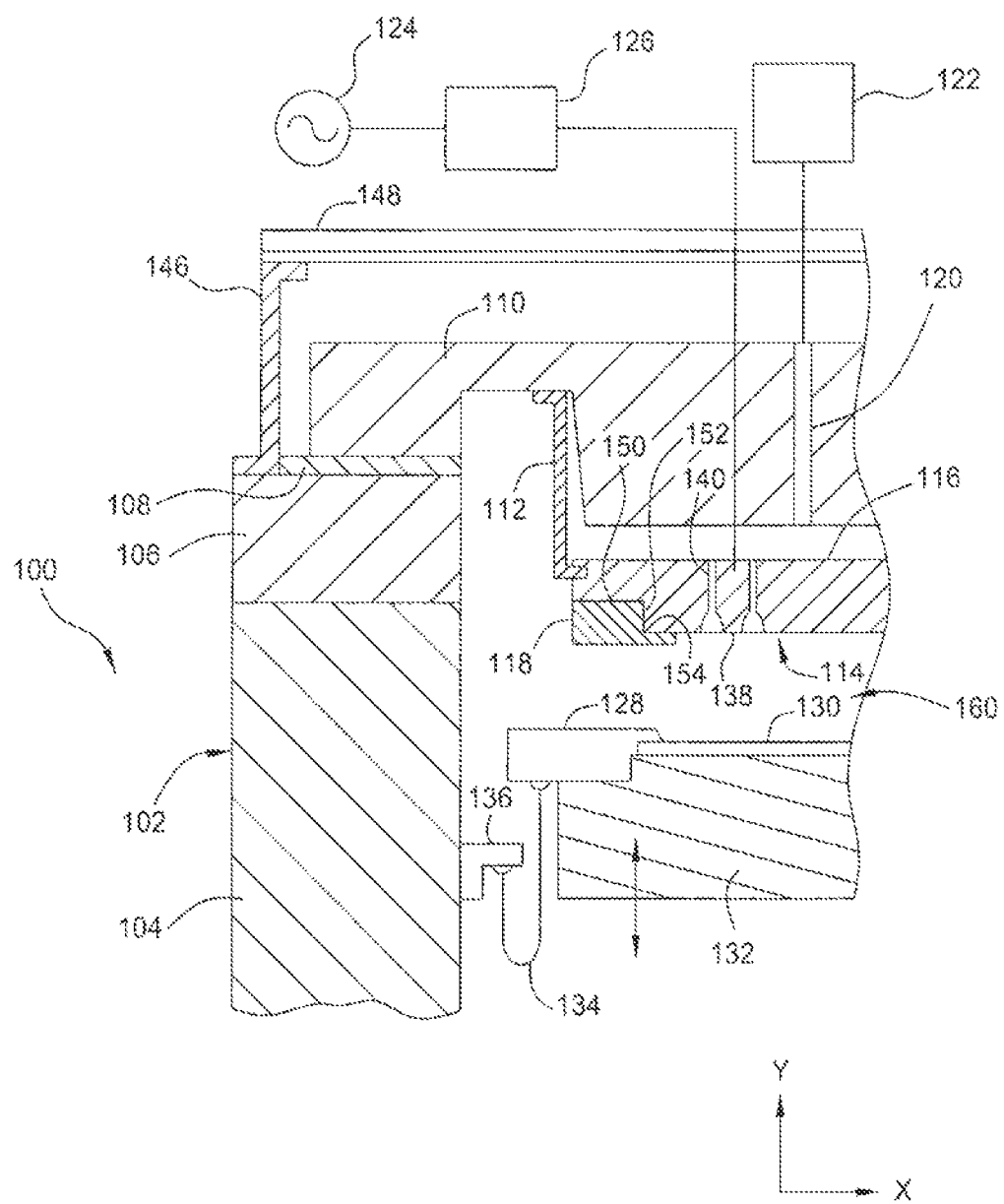
FIG. 1 depicts a partial sectional view of one embodiment of a PECVD processing chamber having a shield frame assembly.

FIG. 1 depicts a partial sectional view of one embodiment of a processing chamber 100 having a shielded showerhead assembly 114. The processing chamber 100 includes a chamber body 102 coupled to an RF power source 124 and gas panel 122. The chamber body 102 includes walls 104 and a lid 106 which are generally fabricated from a conductive material. The chamber body 102 confines a processing region 160 above a substrate support 132 on which a substrate 130 is processed. The backing plate 110 is disposed on the lid 106. An insulator 108 is disposed between the backing plate 110 and the lid 106 to provide electrical isolation.

The showerhead assembly 114 is suspended below the backing plate 110 by a bracket 112. The showerhead assembly 114 generally includes a gas distribution plate 116 and a dielectric shield frame assembly 118. Process and/or cleaning gas is delivered from the gas panel 122 through a gas channel 120 through the backing plate 110 to provide gas into the interstitial space between the gas distribution plate 116 and the backing plate 110. Gas in the interstitial space flows through a plurality of gas passages 140 formed through the gas distribution plate 116 and into the processing region 160 defined between a bottom 138 of the gas distribution plate 116 and the substrate 130 supported on the substrate support 132. RF power provided through a matching circuit 126 to the gas distribution plate 116 energizes the gases disposed between the gas distribution plate 116 and the substrate 130 to maintain a plasma to facilitate deposition on the substrate 130.

The edge of the substrate 130 is covered by a shadow frame 128 to prevent deposition along the perimeter of the substrate 130 during processing. The shadow frame 128 and/or substrate support 132 is electrically coupled to the walls 104 of the chamber body 102 by a ground RF return path 134, such as a conductive strap. The chamber walls 104 additionally include a shadow frame support 136 which supports and lifts the shadow frame 128 off of the substrate support 132, and the substrate support 132 is lowered to facilitate substrate transfer. RF power traveling along the surface of the chamber walls 104 and lid 106 is returned to the RF power source 124 through a bracket 146 and cover 148.

The gas distribution plate 116 generally includes a step 150 along its perimeter. Corners 154 formed by an inner wall 152 of the step 150 intersecting the bottom 138 of the gas distribution plate 116 generally have high electric fields due to their geometry. To prevent arcing at these locations, the dielectric shield frame assembly 118 is disposed in step 150 and tightly fitted against the inner wall 152. As the high concentration electric fields produced along the inner wall 152 are located in the dielectric material of the shield frame assembly 118, arcing between the gas distribution plate 116 and grounded chamber components such as the lid 106 and/or chamber walls 104 is greatly reduced. The dielectric shield frame assembly 118 is secured to the gas distribution plate 116 by fasteners or other suitable method (described further below). The fasteners are configured to allow the shield frame assembly 118 to accommodate thermal expansion and contraction of the gas distribution plate 116, while maintaining little or no gap between the inner wall 152 of the gas distribution plate 116 and the dielectric shield frame assembly 118, and also little or no gap between the components of the shield frame assembly itself.

FIG. 2 depicts a bottom view of one embodiment of the shield frame assembly 118. The shield frame assembly 118 comprises at least four frame members arranged in a quadrilateral ring. In the embodiment depicted in FIG. 2, the shield frame assembly 118 includes a short frame member 202, a long frame member 252, a short frame member 254 and a long frame member 256. The short frame members 202, 254 are elongated and have a parallel orientation. The long frame members 252, 256 are elongated and have a parallel orientation that is substantially perpendicular to the orientation of the short frame members 202, 254. Each of the frame members 202, 252, 254, 256 have a fixed end which is secured to the gas distribution plate 116 and a free end which is secured to the gas distribution plate 116 in a manner that permits the gas distribution plate to move relative to the frame member in response to thermal expansion and contraction of the gas distribution plate 116.

In the embodiment depicted in FIG. 2, the short frame member 202 has a substantially rectangular form, having a fixed end 204, a free end 206, an outer long side 208 and an inner long side 210. The inner long side 210 abuts the inner wall 152 of the gas distribution plate 116. The outer long side 208 has an orientation generally parallel to the inner long side 210. The fixed end 204 has a hole 216 formed therethrough which accepts a static pin 218 which secures the short frame member 202 to the gas distribution plate 116. The hole 216 is dimensioned to have a close fit to the static pin 218, such that the short frame member 202 has little or no motion relative to the static pin 218 which is threaded, press fit or otherwise secured to the gas distribution plate 116. In one embodiment, the static pin 218 is engaged with a threaded hole 230 (seen in FIG. 5A) formed in the gas distribution plate 116.

The free end 206 of the short frame member 202 is disposed opposite the fixed end 204. A slot 212 is formed through the short frame member proximate the free end 206. The slot 212 has an orientation generally parallel with the orientation of the long sides 208, 210 and may be aligned with a hole 216 formed through the fixed end 204. A guide pin 214 is disposed through the slot 212 to slideably secure the free end 206 of the short frame member 202 to the gas distribution plate 116. The guide pin 214 and slot 212 have a clearance fit which allows the free end 206 of the short frame member 202 to move in a direction parallel with the orientation of the slot 212 and long sides 208, 210, while maintaining a close fit between the inner long side 210 and the inner wall 152 of the gas distribution plate 116.

The long frame member 252 includes a fixed end 264, a free end 266, an outer long side 268 and an inner long side 270. The ends 264, 266 and sides 268, 270 are generally of the long frame member 252 and have an orientation similar to as described with the short frame member 202. The fixed end 264 of the long frame member 252 abuts the inner long side 210 of the short frame member 202 proximate the free end 206 at an interface 220. A static pin 218 secures the fixed end 264 of the long frame member 252 to the gas distribution plate 116, while a guide pin 214 disposed through a slot 212 secures the free end 266 to the gas distribution plate 116 as described above with reference to the short frame member 202. Since the fixed end 264 of the long frame member 252 is pinned in a substantially stationary position relative to the gas distribution plate 116, the free end 206 of the short frame member 202 is free to slide across the fixed end 264 of the long frame member 252 without creating a gap at the interface 220 of the abutting portions of the fixed end 264 of the long frame member 252 and the inner long side 210 of the short frame member 202.

The short frame member 254 is substantially identical to the short frame member 202. The short frame member 254 has a substantially rectangular form, having a fixed end 274, a free end 276, an outer long side 278 and an inner long side 280. The inner long side 280 abuts the inner wall 152 of the gas distribution plate 116. The outer long side 278 has an orientation generally parallel to the inner long side 280. The fixed end 274 has a hole 216 formed therethrough which accepts a static pin 218 which secures the short frame member 254 to the gas distribution plate 116. The hole 216 is dimensioned with a close fit to the static pin 218, such that the short frame member 254 has little or no motion relative to the static pin 218 which is threaded, press fit or otherwise secured to the gas distribution plate 116. In one embodiment, the static pin 218 is engaged with a threaded hole 230 formed in the gas distribution plate 116.

The fixed end 274 of the short frame member 254 abuts the inner long side 270 of the long frame member 252 proximate the free end 266 at an interface 222. Since the fixed end 274 of the short frame member 254 is pinned in a substantially stationary position relative to the gas distribution plate 116, the free end 266 of the long frame member 252 is free to slide across the fixed end 274 of the short frame member 254 without creating a gap at the interface 222 of the abutting portions of the fixed end 274 of the short frame member 254 and the inner long side 270 of the long frame member 252.

The free end 276 of the short frame member 254 is disposed opposite the fixed end 274. A slot 212 is formed through the short frame member proximate the free end 276. The slot 212 has an orientation generally parallel with the orientation of the long sides 278, 280 and may be aligned with a hole 216 formed through the fixed end 274. A guide pin 214 is disposed through the slot 212 to slideably secure the free end 276 of the short frame member 254 to the gas distribution plate 116. The guide pin 214 and slot 212 have a clearance fit which allows the free end 276 of the short frame member 254 to move in a direction parallel with the orientation of the slot 212 and long sides 278, 280, while maintaining a close fit between the inner long side 280 and the inner wall 152 of the gas distribution plate 116.

The long frame member 256 is substantially identical to the long frame member 252. The long frame member 256 includes a fixed end 284, a free end 286, an outer long side 288 and an inner long side 290. The ends 284, 286 and sides 288, 290 of the long frame member 256 have an orientation similar to as described with the long frame member 256. The long frame member 256 is coupled to the gas distribution plate 116 by a static pin 218 disposed through a hole 216 and a guide pin 214 disposed through a slot 212. The free end 286 of the long frame member 256 abuts the fixed end 204 of the short frame member 202 proximate the free end 286 at an interface 226. Since the fixed end 204 of the short frame member 202 is pinned in a substantially stationary position relative to the gas distribution plate 116, the inner long side 290 of the long frame member 256 is free to slide across the fixed end 204 of the short frame member 202 without creating a gap at the interface 226 of the abutting portions of the fixed end 204 of the short frame member 202 and the inner long side 290 of the long frame member 256.

The fixed end 284 of the long frame member 256 abuts the inner long side 280 of the short frame member 254 proximate the free end 276 at an interface 224. Since the fixed end 284 of the long frame member 256 is pinned in a substantially stationary position relative to the gas distribution plate 116, the free end 276 of the short frame member 254 is free to slide across the fixed end 284 of the long frame member 256 without creating a gap at the interface 224 of the abutting portions of the fixed end 284 of the long frame member 256 and the inner long side 280 of the short frame member 254.

As discussed above, the frame members 202, 252, 254, 256 accommodate thermal expansion of the gas distribution plate 116 from a cold condition, as illustrated in FIG. 2, to a hot condition, as illustrated in FIG. 3. As further shown in the detail of the interface 224 depicted in FIGS. 4A-4B, the fixed end 284 of the long frame member 256 is substantially fixed against the inner long side 280 of the short frame member 254, as illustrated in FIG. 4C, as the gas distribution plate 116 expands from a cold condition, as illustrated in FIG. 4A, to a hot condition, as illustrated in FIG. 4B, because of the proximately (e.g., closeness) of the relative position of the static pin 218 to the guide pin 214. The motion of the long frame member 256 relative to the short frame member 254 can be seen in the relative change of position of the long frame member 256 to the free end 276 of the short frame member 254, and the change in the position of the guide pin 214 in the slot 212 from the inner end 232 of the slot 212 to the outer end 234 of the slot 212, which is indicative of the expansion of the gas distribution plate 116 which increases the distance between the holes formed in the gas distribution plate 116 which accept the guide pins 214, 218 along a common edge of the gas distribution plate 116.

FIGS. 5A-F depict partial sectional views of the profile, the shield frame assembly and gas distribution plate. As the corner of the gas distribution plate concentrates the electric field at the perimeter of the gas distribution plate when the gas distribution plate is powered, the profile of the shield frame assembly may be designed to either minimize the field and/or position of the electric field concentration within the insulative material comprising the shield frame assembly such that the potential for arcing between the gas distribution plate and other components, such as the chamber wall, is minimized.

Figure 5A:
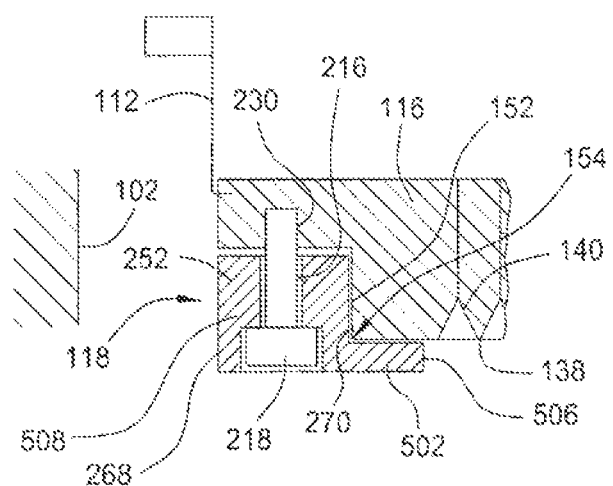

FIG. 5A depicts one embodiment of a profile for the long frame member 252 of the shield frame assembly 118. Other frame members of the shield frame assembly 118 may be similarly configured. The long frame member 252 includes a body 508 having an inwardly extending lip 502. The lip 502 extends to a tip 506 that is above and covering a portion of the bottom 138 of the gas distribution plate 116. Since the lip 502 covers the corner 154 of the gas distribution plate 116, the electric field concentrated at the corner 154 is buried in the long frame member 252 thereby substantially reducing arcing potential between the gas distribution plate 116 and the chamber body 102 and/or other chamber component.

Figure 5B:
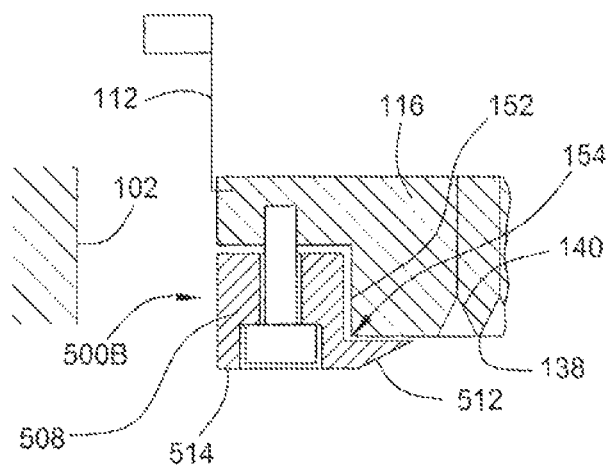

FIG. 5B depicts another embodiment of a profile for a long frame member 500B of the shield frame assembly 118. Other frame members of the shield frame assembly 118 may be similarly configured. The long frame member 500B includes a body 508 having an inwardly extending tapered lip 512. The lip 512 tapers from a top surface 514 of the body 508 that is above the bottom 138 of the gas distribution plate 116. Since the lip 512 covers the corner 154 of the gas distribution plate 116 and the top surface 514 of the body 508 is spaced above the bottom 138 of the gas distribution plate 116, the electric field concentrated at the corner 154 is buried in the long frame member 500B, thereby substantially reducing arcing potential between the gas distribution plate 116 and the chamber body 102 and/or other chamber component.

Figure 5C:
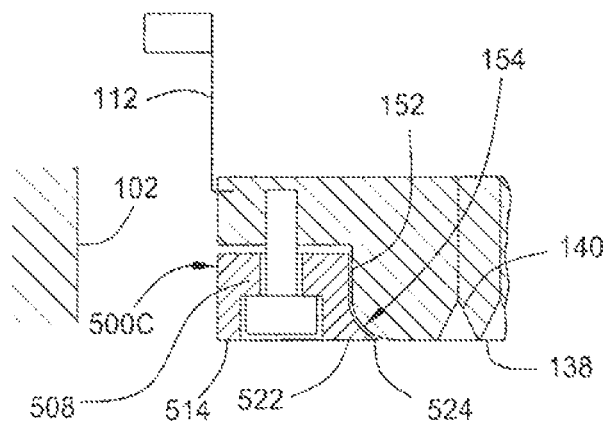

FIG. 5C depicts another embodiment of a profile for a long frame member 500C of the shield frame assembly 118. Other frame members of the shield frame assembly 118 may be similarly configured. The long frame member 500C includes a body 508 having an inwardly extending lip 522. The lip 522 is generally coplanar with a top surface 514 of the body 508 that is substantially coplanar with the bottom 138 of the gas distribution plate 116. The lip 522 extends to an end 524, and returns to the body 508 through a curved surface 520. The profile, or curvature, of the surface 520 is selected to mate with the shape of the corner 154, shown in FIG. 5C as having radius. The radius of the corner 154 serves to reduce the electric field concentrated at the corner 154. Since the lip 522 covers the curved corner 154 of the gas distribution plate 116, the reduced electric field concentrated at the curved corner 154 is still buried in the long frame member 500C, thereby substantially reducing arcing potential between the gas distribution plate 116 and the chamber body 102 and/or other chamber component.

Figure 5D:
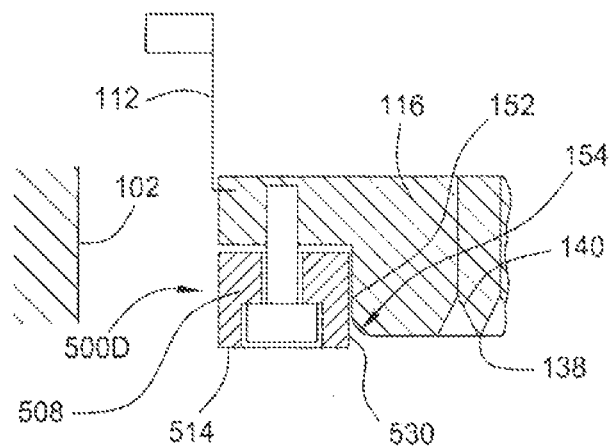

FIG. 5D depicts another embodiment of a profile for a long frame member 500D of the shield frame assembly 118. Other frame members of the shield frame assembly 118 may be similarly configured.

In the embodiment depicted in FIG. 5D, a top surface 514 of a body 508 of the long frame member 500D extends beyond the bottom 138 of the gas distribution plate 116. Thus, even though the inner edge 530 of the body 508 does not mate with the entire profile of the top curved corner 154, the reduced electric field concentrated at the curved corner 154 is still buried below the elevated top 514 of the long frame member 500D, thereby substantially reducing arcing potential.

Figure 5E:
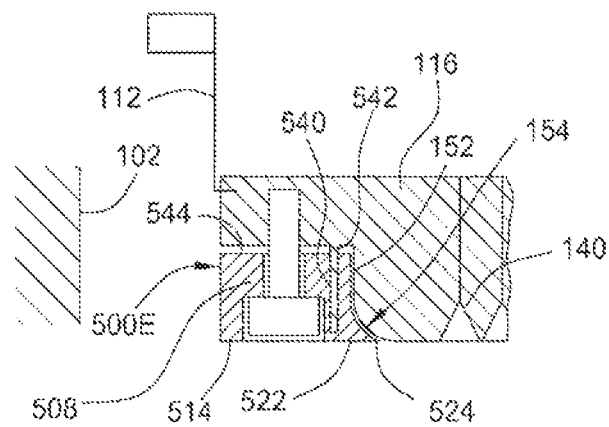

FIG. 5E depicts another embodiment of a profile for a long frame member 500E of the shield frame assembly 118. Other frame members of the shield frame assembly 118 may be similarly configured. In the embodiment depicted in FIG. 5E, a body 508 of the long frame member 500E is substantially coplanar with the bottom 138 of the gas distribution plate 116. The long frame member 500E includes a lip 522 substantially mating with a rounded corner 154 similar to as described with reference to the long frame member 500C. The long frame member 500E additionally includes a slot 540 extending from a bottom surface 544 of the body 508 toward the top surface 514. A conducting element 542 that is electrically coupled to the gas distribution plate 116 is disposed in the slot 540 or otherwise buried in the body 508 of the long frame member 500E. The slot 540 extends along the length of the long frame member 500E. The conducting element 542 operates at essentially the same voltage of the gas distribution plate 116, thereby reducing the electrical field at the exposed corner 154 of the showerhead assembly, additionally concentrating the electric field lines substantially within the body 508, thereby substantially reducing arcing potential. In the embodiment depicted in FIG. 5E, the conducting element 542 is depicted as a tab extending from the gas distribution plate 116 into the long frame member 500E. It is contemplated that the conducting element 542 may have other configurations buried within otherwise interleaving with the material comprising the long frame member 500E in a manner that substantially reduces arcing potential.

Figure 5F:
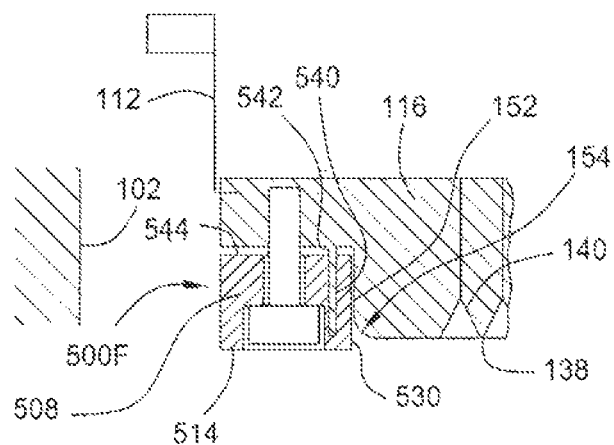

FIG. 5F depicts another embodiment of a profile for a long frame member 500F of the shield frame assembly 118. Other frame members of the shield frame assembly 118 may be similarly configured. The long frame member 500F is configured similar to the long frame member 500E described above, including a slot 540 which accepts a conducting element 542, except wherein the top surface 514 of the body 508 extends beyond the bottom 138 of the gas distribution plate 116. Although a lip is not shown in the embodiment depicted in FIG. 5F, it is contemplated that a lip such as the lip 522 and/or the lip 502 or the lip 512 may be utilized to cover the corner 154 to enhance the reduction of arcing potential.

FIG. 6 is a plan view of another embodiment of a shield frame assembly 600. The shield frame assembly 600 is substantially similar to the shield frame assembly 118 and includes a short frame member 602, a long frame member 606, a short frame member 604 and a long frame member 608. The short frame members 602, 604 are elongated and have a parallel orientation. The long frame members 606, 608 are elongated and have a parallel orientation that is substantially perpendicular to the orientation of the short frame members 602, 604. Each of the frame members 602, 604, 606, 608 have a fixed end 632 which is secured to the gas distribution plate 116 (not shown in FIG. 6) and a free end 630 which is secured to the gas distribution plate 116 in a manner that permits the gas distribution plate to move relative to the frame member in response to thermal expansion and contraction of the gas distribution plate 116.

Each of the frame members 602, 604, 606, 608 includes an outer edge 610 and an inner edge 622. The outer edge 610 of the frame members 602, 604, 606, 608 may have a linear orientation. The inner edges 622 of the shield frame assembly 600 differs from the inner edges of shield frame assembly 118 in that the inner edges 622 of each of the frame members 602, 604, 606, 608 has a concave portion 612. The concave portion 612 of the inner edge 622 is illustrated compared to a linear dashed reference line 614 extending from the inside corners of the frame members 602, 604, 606, 608. The concave portion 612 of the inner edges 622 allows a substantially uniform gap to be maintained between the shield frame assembly 600 and the gas distribution plate 116 as the center portions of the gas distribution plate 116 expand outward further than the corner portions of the gas distribution plate 116 once heated. Thus, the concave portion 612 of the inner edges 622 minimizes potential rubbing with the gas distribution plate 116 and particle generation.

Each of the inner edges 622 also includes a linear surface portion 618 located at the free end 630 of the frame member in which the slot 212 is formed. The linear surface portion 618 is generally co-linear with the reference line 614 extending from the inside corners of the frame members 602, 604, 606, 608. The linear surface portion 618 provides a flat surface that slides against an end 620 of the fixed end 632, thereby minimizing gaps between adjacent frame members 602, 604, 606, 608 as the shield frame assembly 600 and gas distribution plate 116 expend and contract due to heating and cooling.

Thus, showerhead assembly has been provided that includes an insulative shield frame assembly that tightly fits around the perimeter of a showerhead. Advantageously, the insulative shield frame assembly is configured to maintain a tight fit during thermally-induced expansion and contraction of the showerhead, thereby minimizing arcing potential. Additionally, the insulative shield frame assembly functions to cover and seal the perimeter of the showerhead to prevent arcing to adjacent chamber components. Furthermore, a conducting element is present in some embodiments of the shield frame assembly which is electrically connected to or part of the showerhead such that the conducting element operates at essentially the same voltage of the showerhead, thereby reducing the electric field on the exposed perimeter of the showerhead.

With the example and explanations above, the features and spirits of the embodiments of the invention are described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A showerhead assembly comprising:
 a gas distribution plate;
 an insulative frame assembly circumscribing a perimeter edge of the gas distribution plate; and a conducting element disposed in the insulative frame assembly electrically coupled to the gas distribution plate.

2. The showerhead assembly of claim 1, wherein the conducting element is part of the gas distribution plate.

3. The showerhead assembly of claim 2, wherein the conducting element extends from the gas distribution plate into a slot formed in the insulative frame assembly.

4. The showerhead assembly of claim 1, wherein the insulative frame assembly further comprises:
   a first frame member having a free end; and
   a second frame member having an orientation perpendicular to the first frame member, the second frame member having a fixed end abutting the free end of the first frame member.

5. The showerhead assembly of claim 4, wherein the first frame member is longer than the second frame member and the conducting element electrically couples the gas distribution plate to the first frame member.

6. The showerhead assembly of claim 5, wherein the first frame member has a slot which accepts the conducting element.

7. The showerhead assembly of claim 1, wherein the conducting element is part of the insulative frame assembly.

8. The showerhead assembly of claim 7, wherein the conducting element extends into a slot formed in the gas distribution plate.

9. The showerhead assembly of claim 1, further comprising:
   a static pin configured to secure the insulative frame assembly to the gas distribution plate.

10. A processing chamber, comprising:
    a chamber body having a plurality of walls and a lid which define a processing volume within the chamber body;
    a substrate support disposed in the processing volume, configured to support a substrate for processing;
    a backing plate disposed on the lid;
    an insulator disposed between the backing plate and the lid; and
    a showerhead assembly disposed between the backing plate and the substrate support, wherein the showerhead assembly further comprises:
    a gas distribution plate;
    an insulative frame assembly circumscribing a perimeter edge of the gas distribution plate; and
    a conducting element disposed in the insulative frame assembly electrically coupled to the gas distribution plate.

11. The processing chamber of claim 10, wherein the conducting element of the showerhead assembly is part of the gas distribution plate.

12. The processing chamber of claim 11, wherein the conducting element extends into a slot formed in the insulative frame assembly.

13. The processing chamber of claim 10, wherein the insulative frame assembly further comprises:
    a first frame member having a free end; and
    a second frame member having an orientation perpendicular to the first frame member, the second frame member having a fixed end abutting the free end of the first frame member.

14. The processing chamber of claim 13, wherein the first frame member is longer than the second frame member and the conducting element electrically couples the gas distribution plate to the first frame member.

15. The processing chamber of claim 14, wherein the first frame member has a slot which accepts the conducting element.

16. The processing chamber of claim 10, wherein the conducting element is part of the insulative frame assembly.

17. The processing chamber of claim 16, wherein the conducting element extends into a slot formed in the gas distribution plate.

18. The processing chamber of claim 10, wherein the showerhead assembly further comprises:
    a static pin configured to secure the insulative frame assembly to the gas distribution plate.

* * * * *